United States Patent
Adachi et al.

(10) Patent No.: US 7,205,742 B2
(45) Date of Patent: Apr. 17, 2007

(54) CALIBRATION METHOD

(75) Inventors: Masaru Adachi, Kitakyushu (JP);
Mitsunori Kawabe, Kitakyushu (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 0 days.

(21) Appl. No.: 11/403,831

(22) Filed: Apr. 14, 2006

(65) Prior Publication Data
US 2006/0192514 A1 Aug. 31, 2006

Related U.S. Application Data

(63) Continuation of application No. PCT/JP2004/015061, filed on Oct. 13, 2004.

(30) Foreign Application Priority Data

Oct. 17, 2003 (JP) .............................. 2003-357600

(51) Int. Cl.
*G05B 19/10* (2006.01)
(52) U.S. Cl. ............ 318/567; 318/568.11; 318/568.12; 318/568.13; 318/568.16; 901/47
(58) Field of Classification Search .............. 318/567, 318/568.11, 568.12, 568.13, 568.16, 568.21, 318/568.22, 568.24, 569, 572, 577; 901/47; 345/94; 364/474
See application file for complete search history.

(56) References Cited

U.S. PATENT DOCUMENTS 5,600,760 A * 2/1997 Pryor ........................ 700/259

2004/0245946 A1* 12/2004 Halter ........................ 315/312

FOREIGN PATENT DOCUMENTS

| JP | 2000-190263 | 7/2000 |
|----|-------------|--------|
| JP | 2002-110769 | 4/2002 |

OTHER PUBLICATIONS

International Search Report PCT/JP2004/015061 date of mailing Dec. 28, 2004.

* cited by examiner

*Primary Examiner*—Karen Masih
(74) *Attorney, Agent, or Firm*—Westerman, Hattori, Daniels & Adrian, LLP.

(57) ABSTRACT

In some preferred embodiments of the present invention, a method of performing calibration of an optical axis of a sensor installed on a hand of an arm of a robot by obtaining misalignment of the optical axis of the sensor relative to the hand or by obtaining misalignment of the hand relative to the arm is provided. A method of performing calibration by detecting a teaching tool 11 disposed at a semiconductor wafer placing position of a storage container or a carrying device by a sensor 6 installed on a hand 5 of a robot 1 to teach the position of the semiconductor wafer to the robot 1 includes a step of placing the teaching tool 11 at specified position with the robot 1, a step of predicting the position of the teaching tool 11 detecting the teaching tool 11 with the sensor 6, and a step of obtaining a difference between the position of the teaching tool 11 and the predicted value.

4 Claims, 14 Drawing Sheets

CALIBRATION METHOD

RELATED APPLICATIONS

This application is a continuation-in-part of a National Stage of International Patent Application No. PCT/JP2004/015061, filed on Oct. 13, 2004. This application claims priority under 35 U.S.C. §119 to Japanese Patent Application No. 2003-3574600 filed on Oct. 17, 2003. Each of the entire disclosures of these applications is incorporated herein by reference in its entirety.

BACKGROUND OF THE INVENTION

1. Field of the Invention

The present invention relates to a calibration method, and some preferred embodiments relate to a method of calibrating an optical axis of a sensor mounted on a robot hand to teach a position of a semiconductor wafer to a semiconductor wafer carrying robot.

2. Description of Related Art

The following description sets forth the inventor's knowledge of related art and problems therein and should not be construed as an admission of knowledge in the prior art.

Conventionally, teaching operation of a semiconductor wafer carrying robot is performed such that an operator guides the robot by confirming the position of the wafer to be carried while visually observing the wafer in the same manner as in a common industrial robot. In some cases, however, it is very difficult or impossible to visually observe a wafer in a processing apparatus or the like from the outside. In view of the above, there are some proposed methods/apparatuses called "auto teaching methods/apparatuses" in which a teaching tool having the same size as an actual wafer is disposed in a processing apparatus in place of a wafer and the position of the teaching tool is detected by a sensor installed on a robot's end effector to teach the position to the robot.

The inventors of this invention proposed a method of sensing a teaching tool using a hand equipped with two permeation type sensors (see WO 2003/22534, hereinafter referred to as "Patent Document 1"). In this method, the hand is approached to a small circular disc provided at a teaching tool from different directions to obtain the teaching position of the robot, i.e., R, θ and Z values of the cylindrical coordinate system (R-θ-Z) by applying a least-squares method to the results. Here, the R value denotes the teaching value of the robot arm in the expansion/contraction direction, the θ value denotes the teaching value of the robot in the rotation direction, and the Z value denotes the teaching value of the robot in the up-and-down direction.

On the premise of performing the so-called automatic teaching, it is required that the optical axis of the sensor on the hand is adjusted correctly. However, the aforementioned reference fails to disclose any means for adjusting the optical axis. Furthermore, although the misalignment of the setting angle of the hand itself will also be added as misalignment of the optical axis, no method of correcting the setting angle by obtaining the misalignment of the optical axis correctly has been proposed.

The description herein of advantages and disadvantages of various features, embodiments, methods, and apparatus disclosed in other publications is in no way intended to limit the present invention. Indeed, certain features of the invention may be capable of overcoming certain disadvantages, while still retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a method of calibrating an optical axis of a sensor installed on a robot hand by obtaining misalignment of the optical axis relative to the robot hand.

Among other potential advantages, some embodiments can provide a method of calibrating an optical axis of a sensor installed on a robot hand by obtaining misalignment of the robot hand relative to an arm of the robot.

According to a first aspect of a preferred embodiment of the present invention, a method of calibrating an optical axis of a sensor installed on a hand of an arm of a robot by detecting a teaching tool placed at a semiconductor wafer placing position of a storage container or a carrying device by the sensor to teach the placing position of the semiconductor wafer to the robot, the method, comprising the steps of:

placing the teaching tool at a specified position with the robot;

predicting a position of the teaching tool by detecting the teaching tool with the sensor to obtain a predicted value;

obtaining a difference between the position of the teaching tool and the predicted value; and performing calibration of the optical axis using the difference.

With this embodiment, since the teaching tool is placed at a specified position by the robot and the teaching tool is detected by the sensor to thereby predict the wafer position and calibration of the sensor is performed from the difference between the teaching position and the predicted position, the calibration can be performed easily without using a jig, a gauge or the like.

It is preferable that operation for predicting a position of a semiconductor wafer by detecting the teaching tool with the sensor is repeated at two or more postures different in expansion/contraction amount of the robot arm. In this case, the misalignment of the attaching angle of the hand relative to the arm can be obtained to amend the attaching angle.

It is preferable that the robot uses a carrying device equipped with a calibration station capable of accessing in two or more postures different in expansion/contraction amount of the arm.

It is preferable that the calibration station is provided with a mechanism for holding a wafer in a plane so that a position of the wafer is not shifted when the wafer or the teaching tool is placed with the robot. In this case, when a wafer or a teaching tool is disposed with the robot, the position will not be shifted, and therefore calibration can be performed correctly. Moreover, since calibration can be performed in a state in which the robot is built in a processing unit, even if the robot hand having the sensor is exchanged due to damages caused by collision or the like, automatic teaching can be continuously performed by executing the calibration operation again.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

Figure 1:
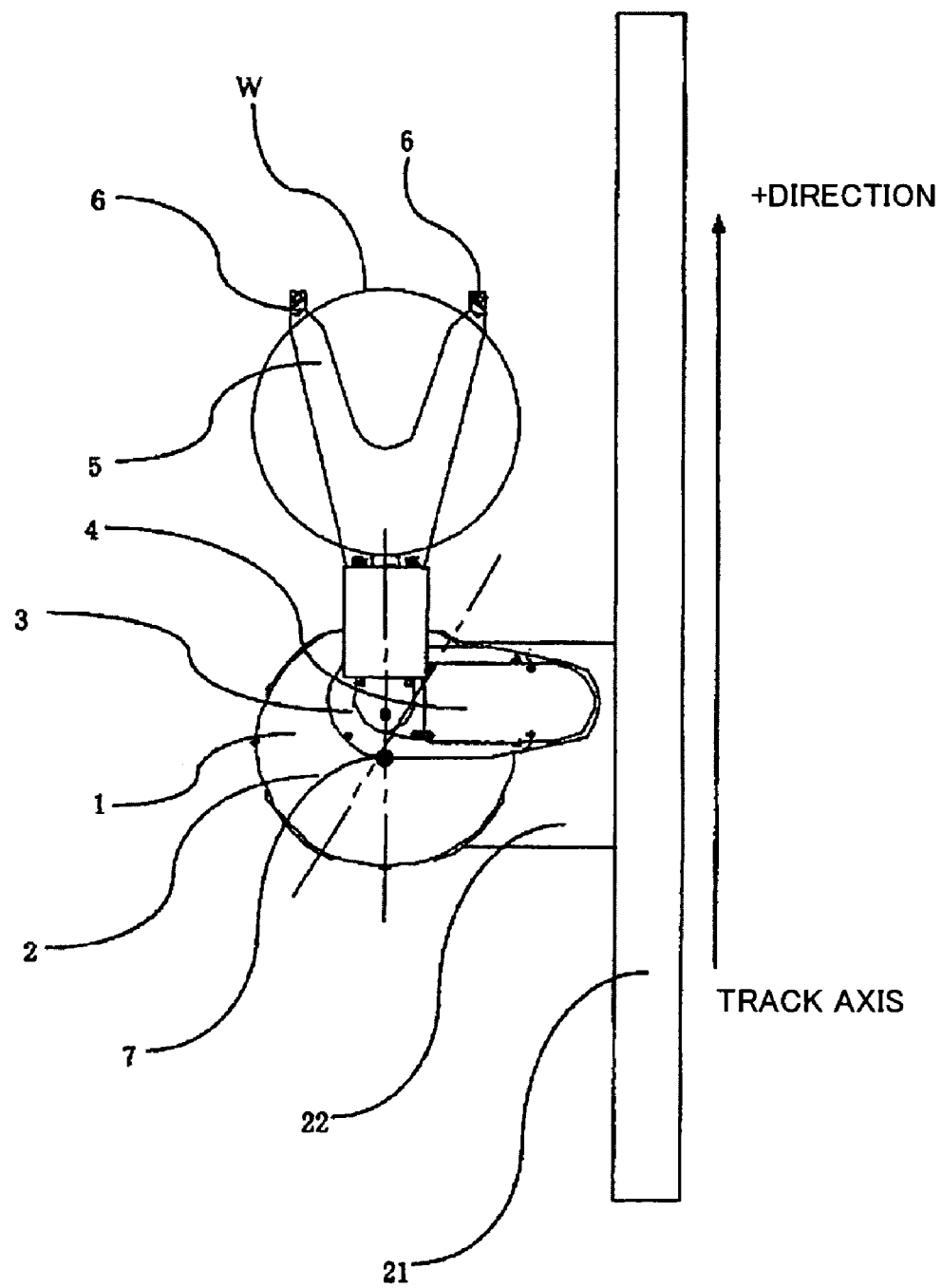
FIG. 1 is a plan view showing a robot for use in an embodiment of the present invention.
Figure 2:
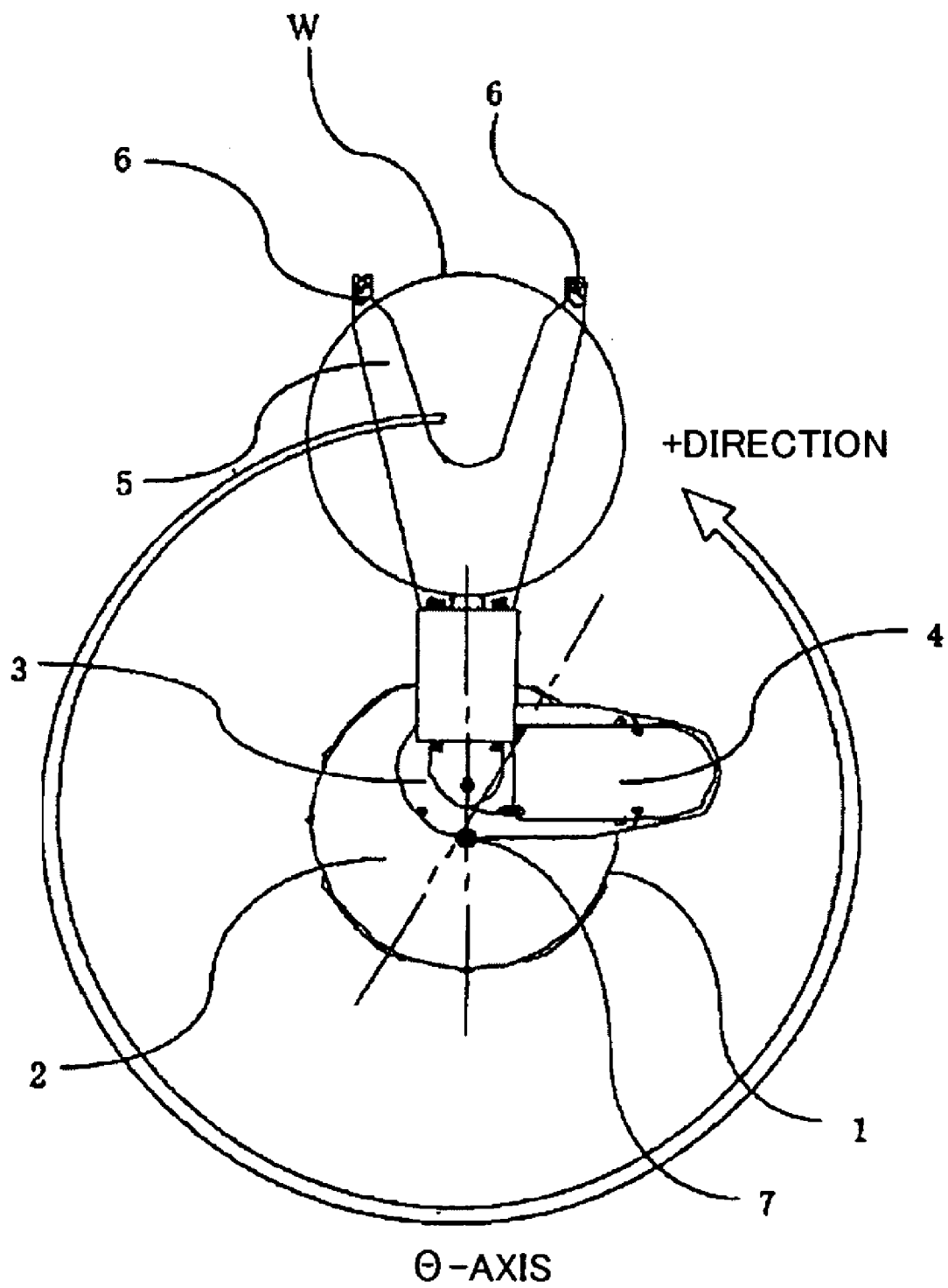
FIG. 2 is a plan view showing the robot for use in an embodiment of the present invention.
Figure 3:
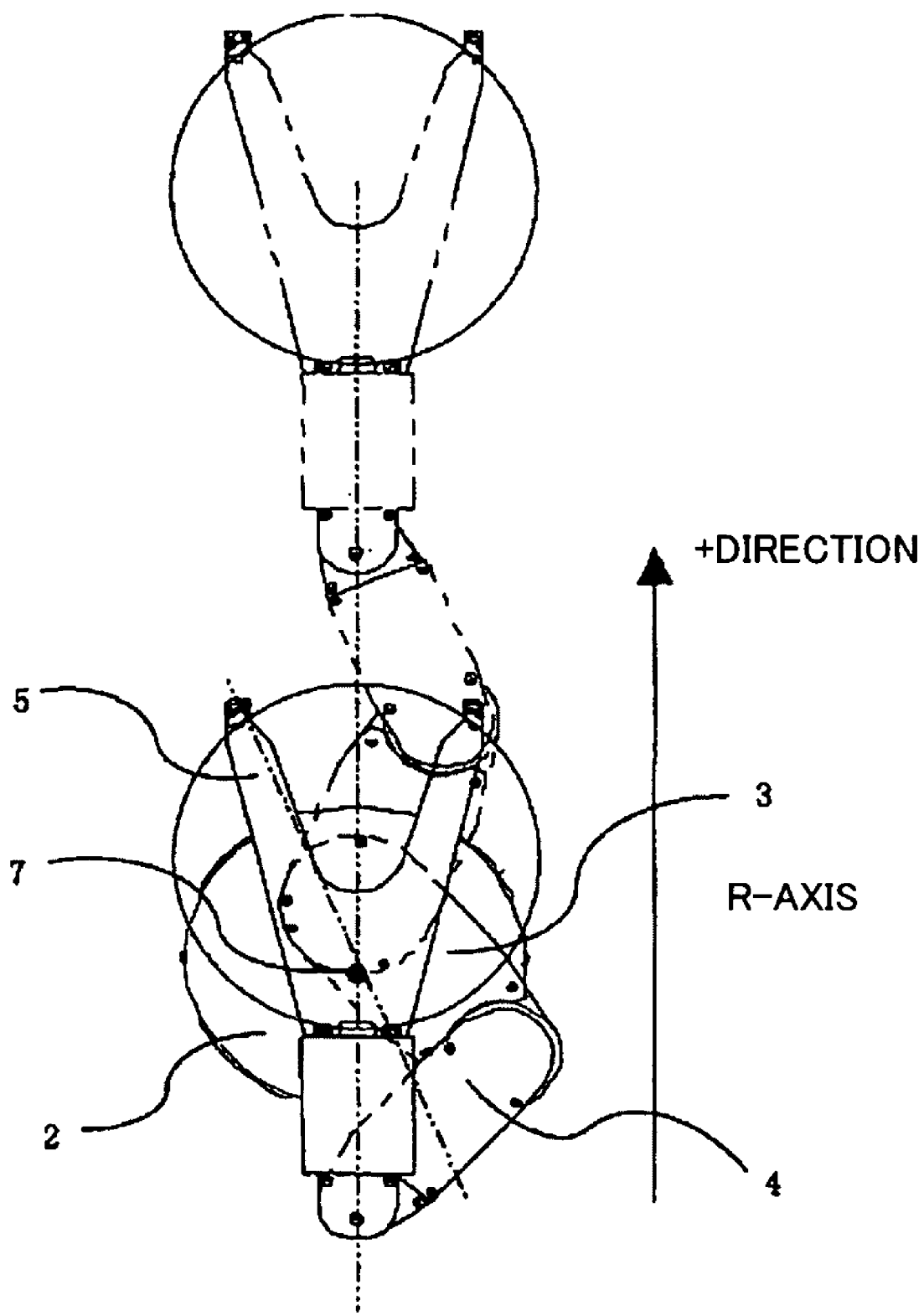
FIG. 3 is a plan view showing the robot for use in an embodiment of the present invention.
Figure 4:
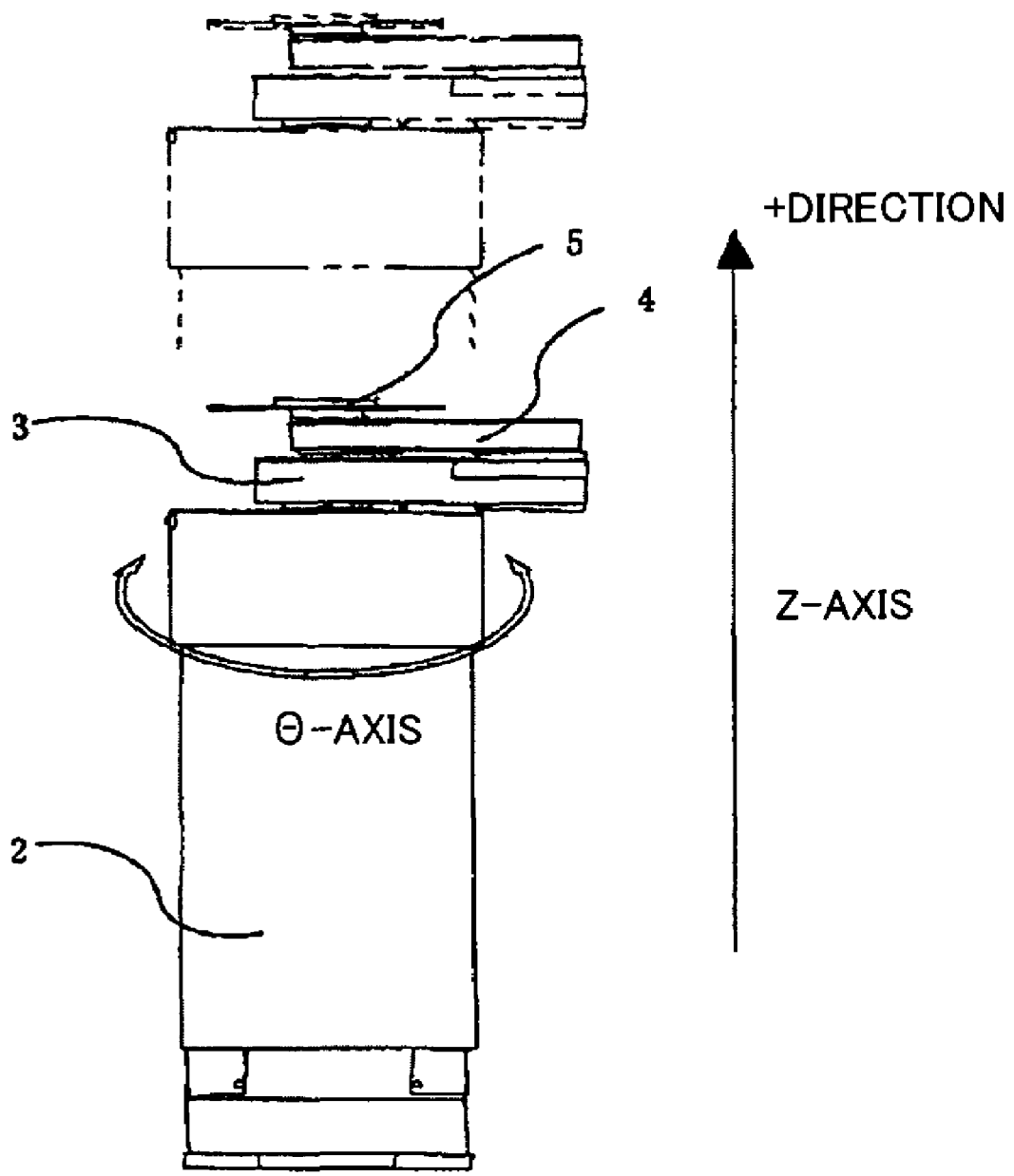
FIG. 4 is a side view showing the robot for use in an embodiment of the present invention.

Each of FIGS. 1 to 4 is an explanatory view of a robot for use in an embodiment of the present invention, wherein FIGS. 1 to 3 are plan views thereof, and FIG. 4 is a side view thereof. In these figures, the reference numeral "1" denotes a horizontal articulated robot for carrying a semiconductor wafer, and the reference letter "W" denotes a semiconductor wafer to be carried. The robot 1 is provided with a first arm 3 capable of rotating within a horizontal plane about the robot rotation central axis 7 of the columnar supporting portion 2 configured to move up and down, a second arm 4 attached to the tip end of the first arm 3 so as to be rotated within a horizontal plane, and a wafer gripping portion 5 attached to the tip end of the second arm 4 so as to be rotated within a horizontal plane. The wafer gripping portion 5 has a Y-shaped hand for disposing a semiconductor wafer W thereon, and is equipped with a set of permeation type sensors 6 at the tip ends of the Y-shaped hand. The reference numeral "21" denotes a track axis unit, and the reference numeral "22" denotes a movable mount of the track axis unit 21. The robot 1 runs along the track axis unit 21 with the robot 1 fixed to the movable mount 22.

As shown in FIGS. 1 to 4, the robot 1 has four degree-of-freedom, i.e., a θ-axis operation (rotation) for rotating the first arm 3 about the central axis 7 of the supporting portion 2 while maintaining the relative angle of the first arm 3, the second arm 4 and the wafer gripping portion 5, an R-axis operation (expansion and contraction) for expanding/contracting the wafer gripping portion 5 in the radial direction of the supporting portion 2 by rotating the first arm 3, the second arm 4 and the wafer gripping portion 5 while maintaining the fixed velocity ratio thereof, and a Z-axis operation (ascent and descent) for moving the supporting portion 2 up and down, a T-axis operation (run) for running the robot 1 itself in accordance with the linear movement of the track axis unit 21. In the θ-axis, the counterclockwise direction is defined as a plus (+) direction (see FIG. 2). In the R-axis, the moving direction of the wafer gripping portion 5 getting away from the supporting portion 2, i.e., the extending direction of the arm is defined as a plus (+) direction (see FIG. 3). In the Z-axis, the direction of raising the supporting portion 2 is defined as a plus (+) direction (see FIG. 4). In the T-axis, the running direction of the robot 1 toward the upper side of the drawing in FIG. 1 is defined as a plus (+) direction (see FIG. 1).

Figure 5:
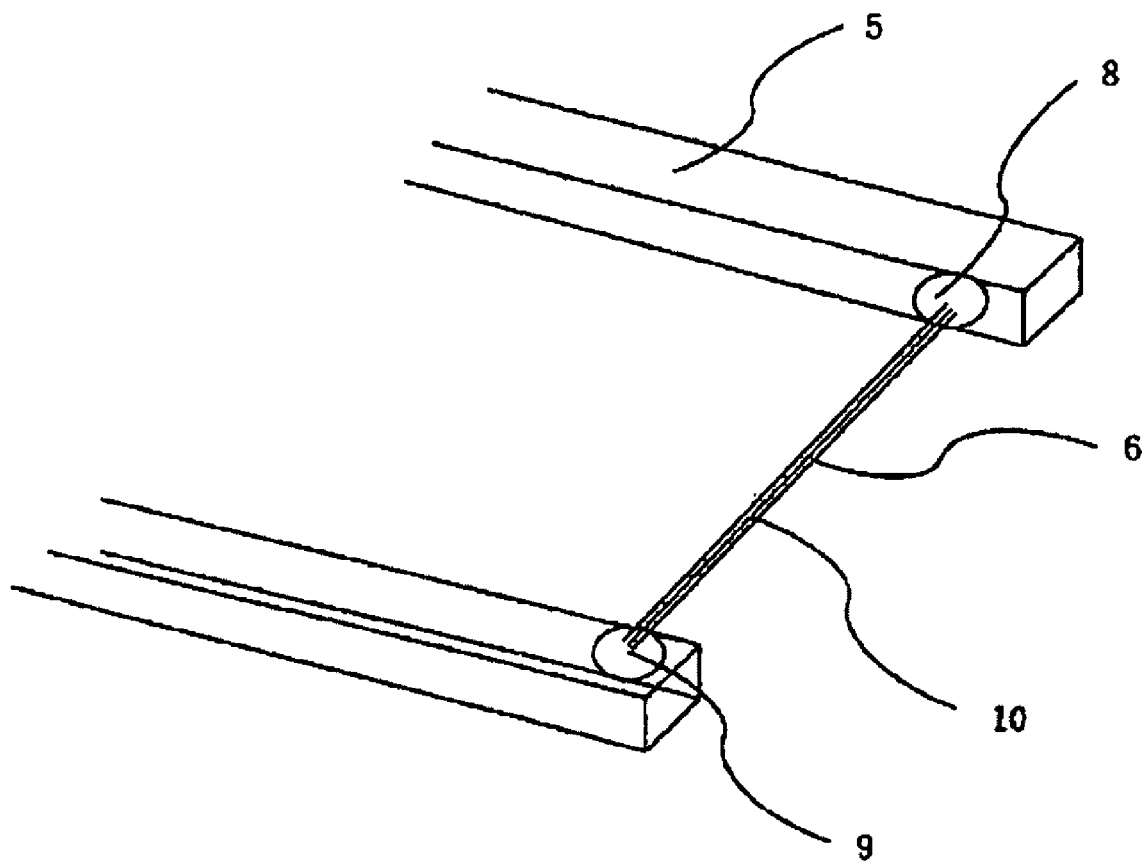
FIG. 5 is an explanatory view showing a permeation type sensor for use in an embodiment of the present invention.

FIG. 5 is an explanatory view showing a permeation type sensor 6. In FIG. 5, the reference numeral "8" denotes a light emitting portion attached to one end of the Y-shaped wafer gripping portion 5, and the reference numeral "9" denotes a light receiving portion attached to the other end of the Y-shaped wafer gripping portion 5 so as to face to the light emitting portion 8. The light emitting portion 8 and the light receiving portion 9 constitute the permeation type sensor 6. The reference numeral "10" denotes an optical axis extending from the light emitting portion 8 to the light receiving portion 9, and the permeation type sensor 6 can detect an object which interrupts the optical axis 10.

Figure 6:
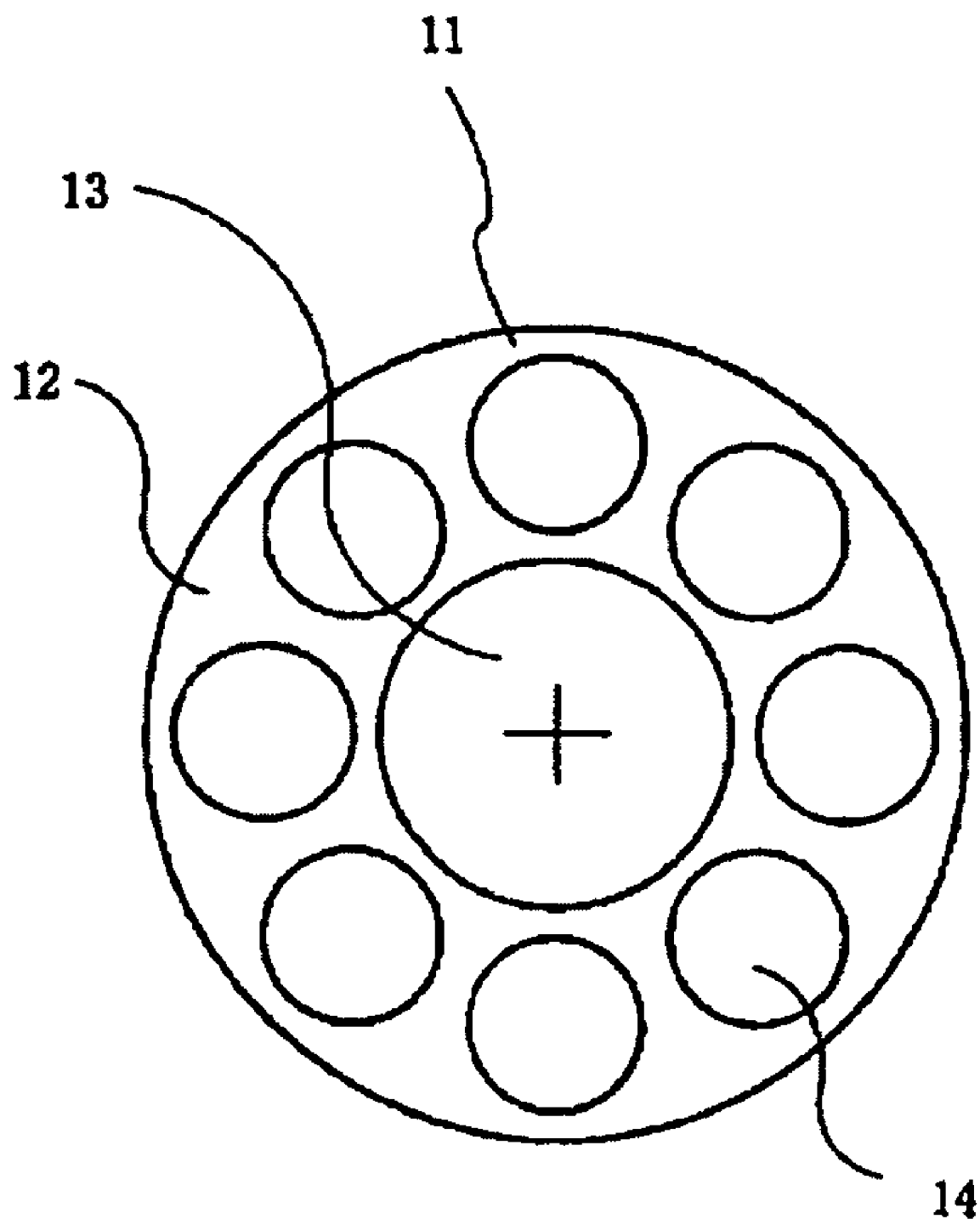
FIG. 6 is an explanatory view showing a teaching tool for use in an embodiment of the present invention.
Figure 7A:
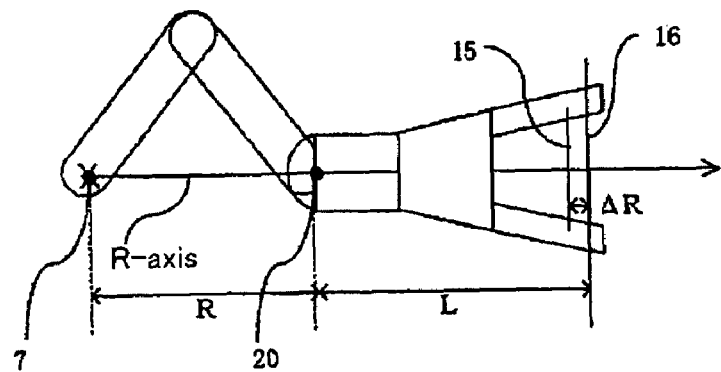
FIG. 7A is an explanatory view showing misalignment of an optical axis of a sensor.
Figure 7B:
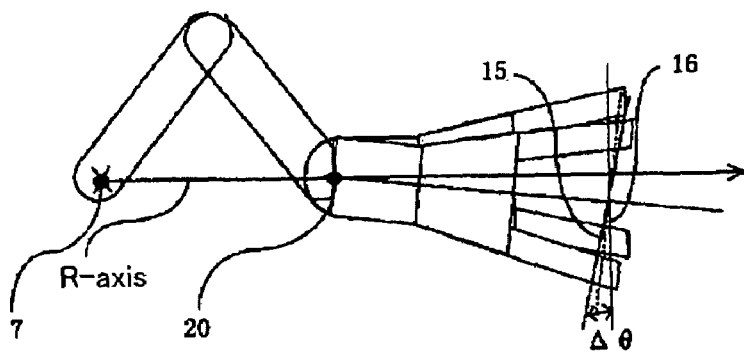
FIG. 7B is another explanatory view showing misalignment of the optical axis of the sensor.
Figure 7C:
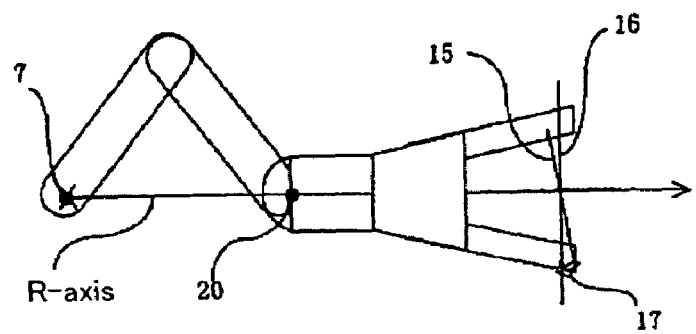
FIG. 7C is yet another explanatory view showing misalignment of the optical axis of the sensor.
Figure 7D:
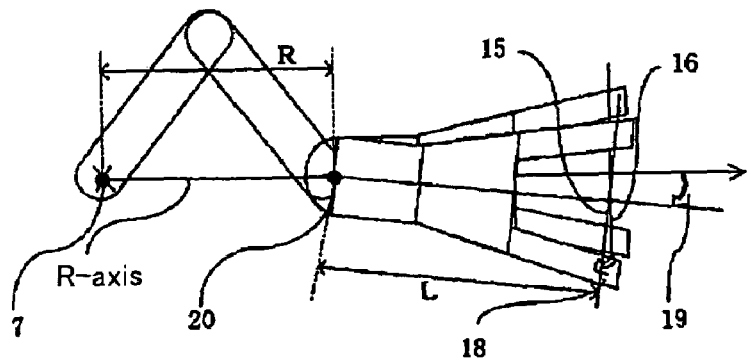
FIG. 7D is still yet another explanatory view showing misalignment of the optical axis of the sensor.

FIG. 6 is an explanatory view showing a teaching tool 11 for use in an embodiment of the present invention. In FIG. 6, this teaching tool 11 includes a large circular disc portion 12 and a small circular disc portion 13 combined concentrically with each other, and the large circular disc portion 12 is the same as an actual wafer in diameter. Since weight saving holes 14 are formed in the large circular disc portion 12 to reduce the weight, this teaching tool 11 can be held in the same manner as a wafer is held by the robot and then disposed on a station. In this embodiment, the thickness of the large circular disc portion 12 is set to about 2 mm which is larger than the thickness 0.7 mm of the semiconductor wafer. It should be understood, however, that the thickness of about 2 mm is determined from the restriction of the intensity and therefore it is preferably set to the same thickness as that of a semiconductor wafer.

FIGS. 7A to 7D are explanatory views showing misalignment of the optical axis of the sensor 6, and are plan views each showing the first arm 3, the second arm 4, and the wafer gripping portion 5. There are two types of misalignment of the optical axis, one is ΔR (see FIG. 7A) which is the misalignment of the optical axis in the direction of the R-axis, and the other is Δθ (see FIG. 7B) which is the misalignment of the optical axis in the direction of the rotational direction. Although the position of the optical axis 10 of the sensor 6 is designed so that the sensor 6 is attached to the position apart from the rotational center of the wafer gripping portion 5 by a distance L, the position can be misaligned backward or forward during the assembling operation, which is the ΔR. Δθ is caused by two factors. One of them is the misalignment angle α between the ideal optical axis 16 (line perpendicular to the R-axis) and the real optical axis 15 shown in FIG. 7C. This is a constant value relative to the robot rotation central axis 7. The other is the misalignment angle β of the wafer gripping portion 5 shown in FIG. 7D. This is not a constant relative to the robot rotation center axis 7, and changes in proportion to the posture of the arms 3 and 4, i.e., the expansion/contraction amount of the arms 3 and 4. If the distance from the robot rotation central axis 7 to the wafer gripping portion rotational center 20 is defined as "R," the influence angle β' at the time of sensing can be given by the following Expression (1).

$$\beta' = \beta \neq \frac{L}{R+L} \quad (1)$$

Accordingly, the compensation amount Δθ can be given by the following Expression (2). By obtaining the coefficients α and β, the calibration of the sensor can be executed.

$$\Delta\theta = \alpha + \beta' = \alpha + \beta \neq \frac{L}{R+L} \quad (2)$$

Figure 8:
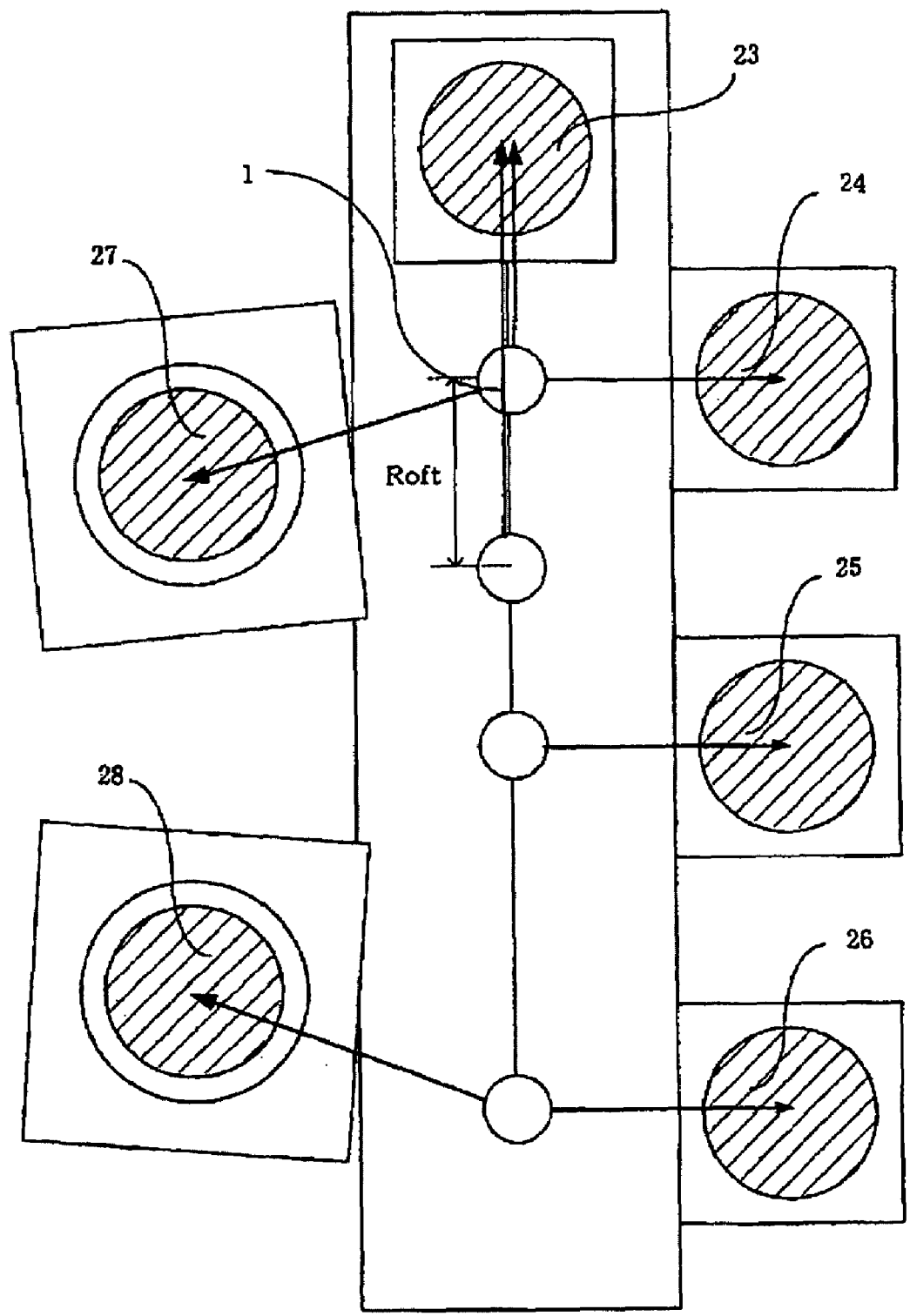
FIG. 8 is an explanatory view showing a carrying device according to an embodiment of the present invention.

FIG. 8 is a plan view showing a wafer carrying device for use in an embodiment of the present invention. In FIG. 8, the reference numeral "23" denotes a temporary station, the station 24, the station 25, and the station 26 are storage containers, the station 27 and the station 28 are load locks. A semiconductor wafer is conveyed among the stations 24 to 28 by the robot (not shown). The temporary station 23 is installed at a position which does not interfere with the robot 1 when the robot 1 accesses the stations 24 to 28. By shifting the position of the robot 1 using the T-axis (run axis), the temporary station 23 is installed at the position where the robot 1 can access in postures different in expansion/contraction amount of the arms. That is, the temporary station 23 is installed on the extension of the robot run axis (T-axis).

Figure 9A:
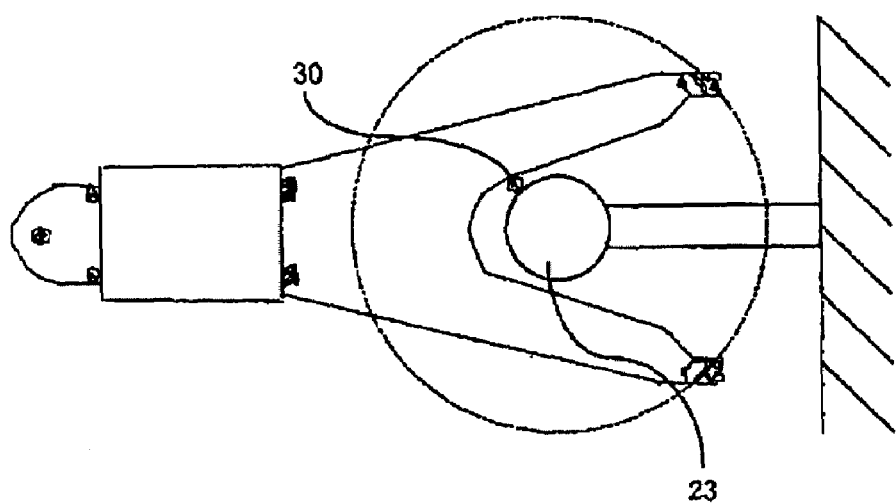
FIG. 9A is an explanatory top view showing a temporary station according to an embodiment of the present invention.
Figure 9B:
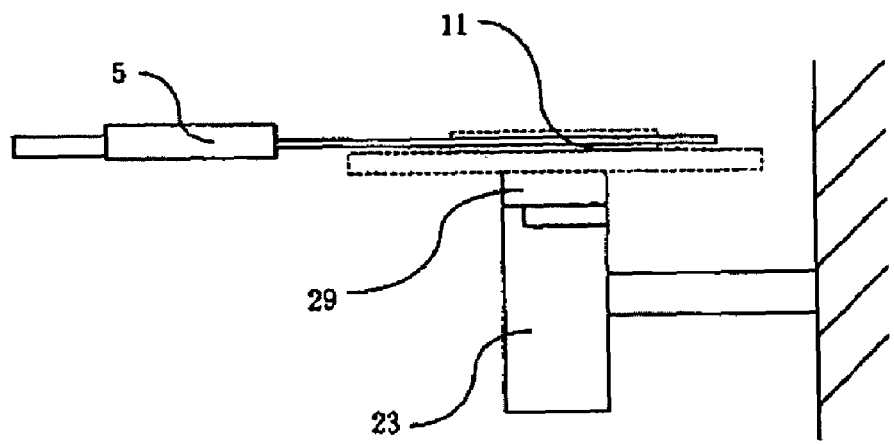
FIG. 9B is an explanatory side view showing the temporary station shown in FIG. 9A.

FIG. 9A is an explanatory plan view showing a temporary station 23 for use in an embodiment of the present invention, and FIG. 9B is an explanatory side view showing the temporary station 23. The temporary station 23 is formed into a columnar shape and fixed to the side wall with a stay. The carrying face 29 of the temporary station 23 is made of rubber materials to increase the friction to a teaching tool 11 so as not to cause position misalignment at the time of disposing the teaching tool 11 by the robot 1. As shown in FIG. 9A, a clearance 30 is secured between the cutout portion of the central portion of the wafer gripping portion 5 and the columnar portion of the temporary station 23. This clearance 30 is provided so that the teaching tool 11 can be assuredly disposed on the temporary station 23 even if the placing position by the robot 1 is shifted rightward, leftward, rearward or frontward by a certain distance.

Figure 10:
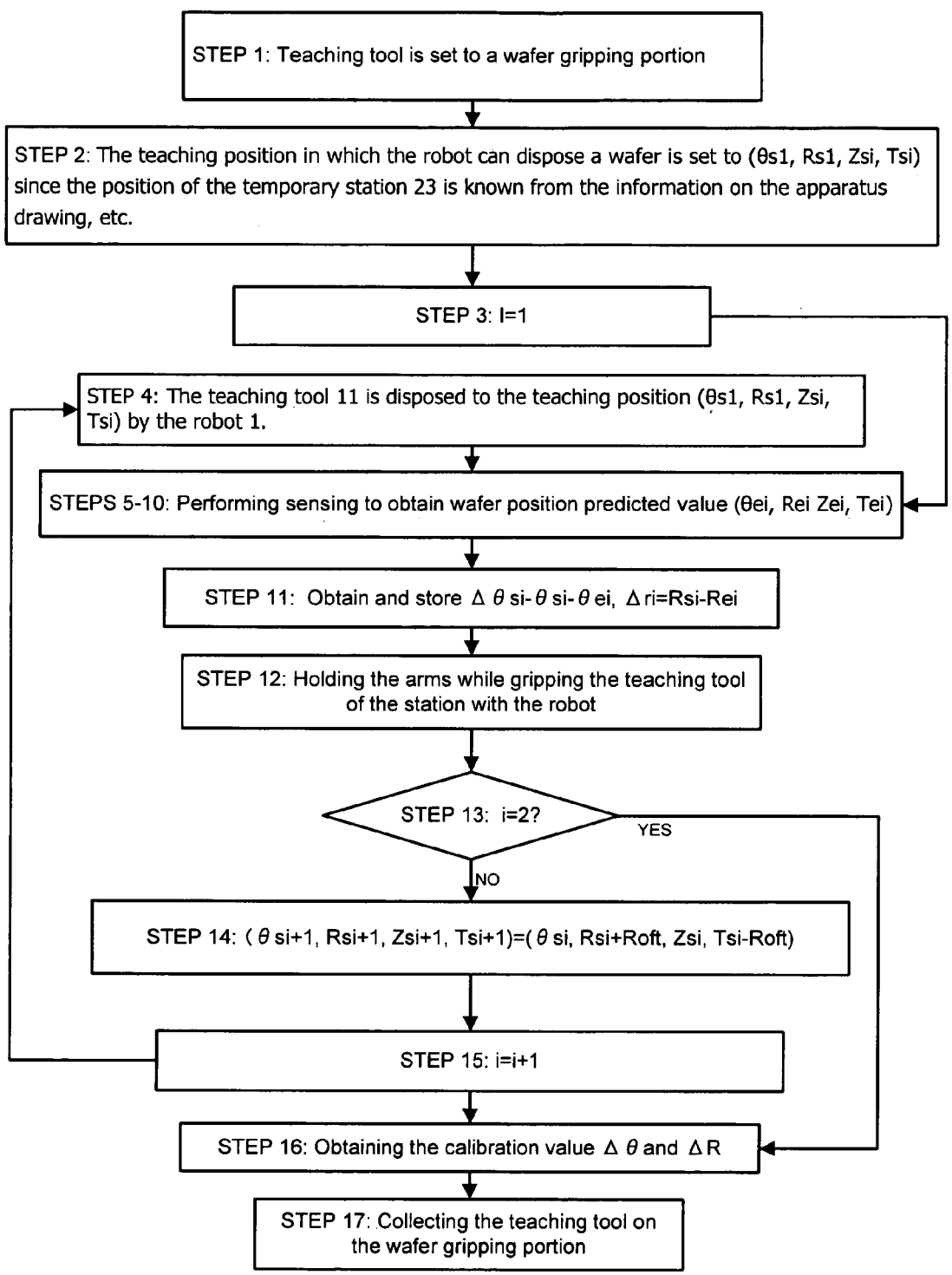
FIG. 10 is a flowchart of a calibration method according to an embodiment of the present invention.
Figures 11A, 11B:
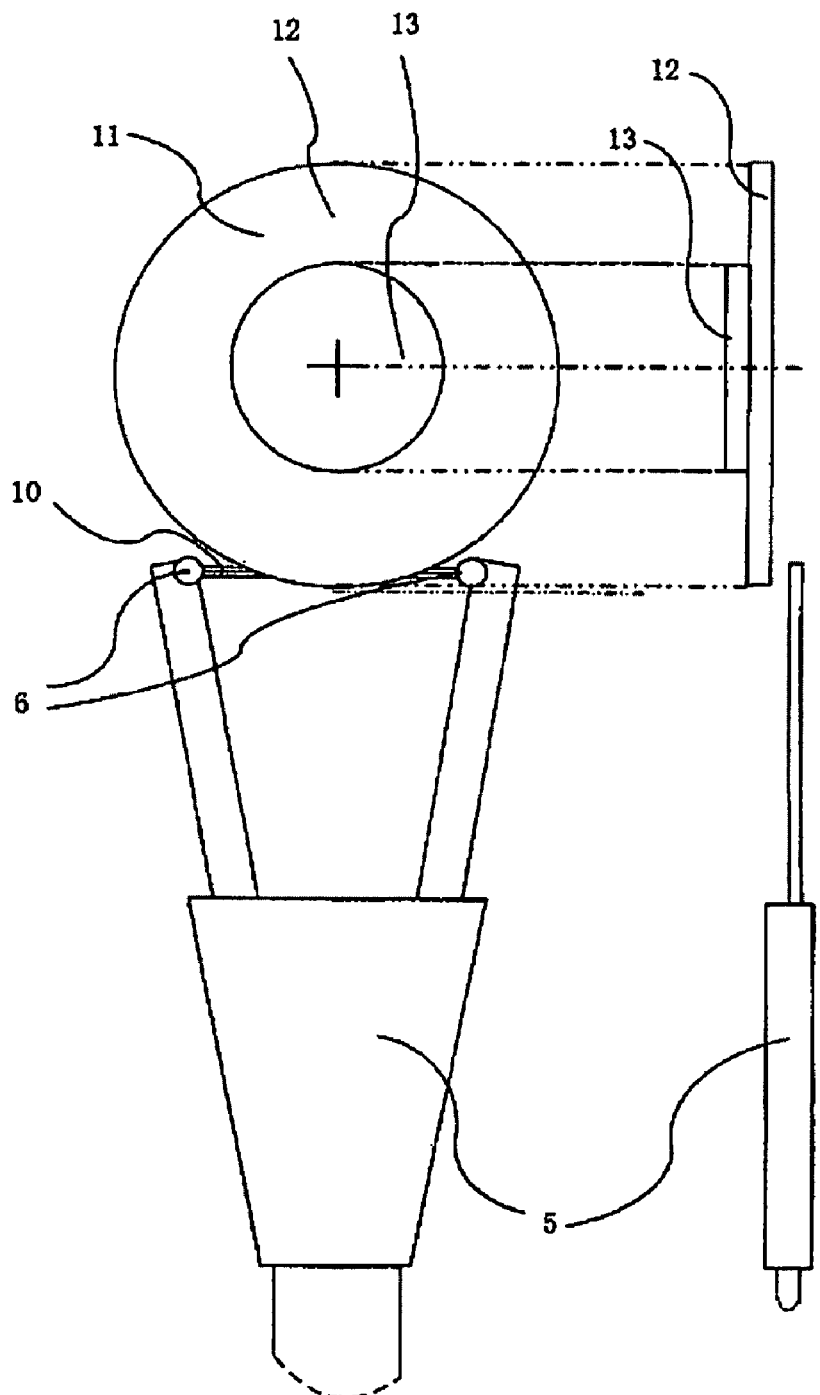
FIG. 11A is an explanatory top view showing the positional relationship between a wafer gripping portion and a teaching tool during the calibration operation.
FIG. 11B is an explanatory side view showing the positional relationship between a wafer gripping portion and a teaching tool during the calibration operation.
Figures 12A, 12B:
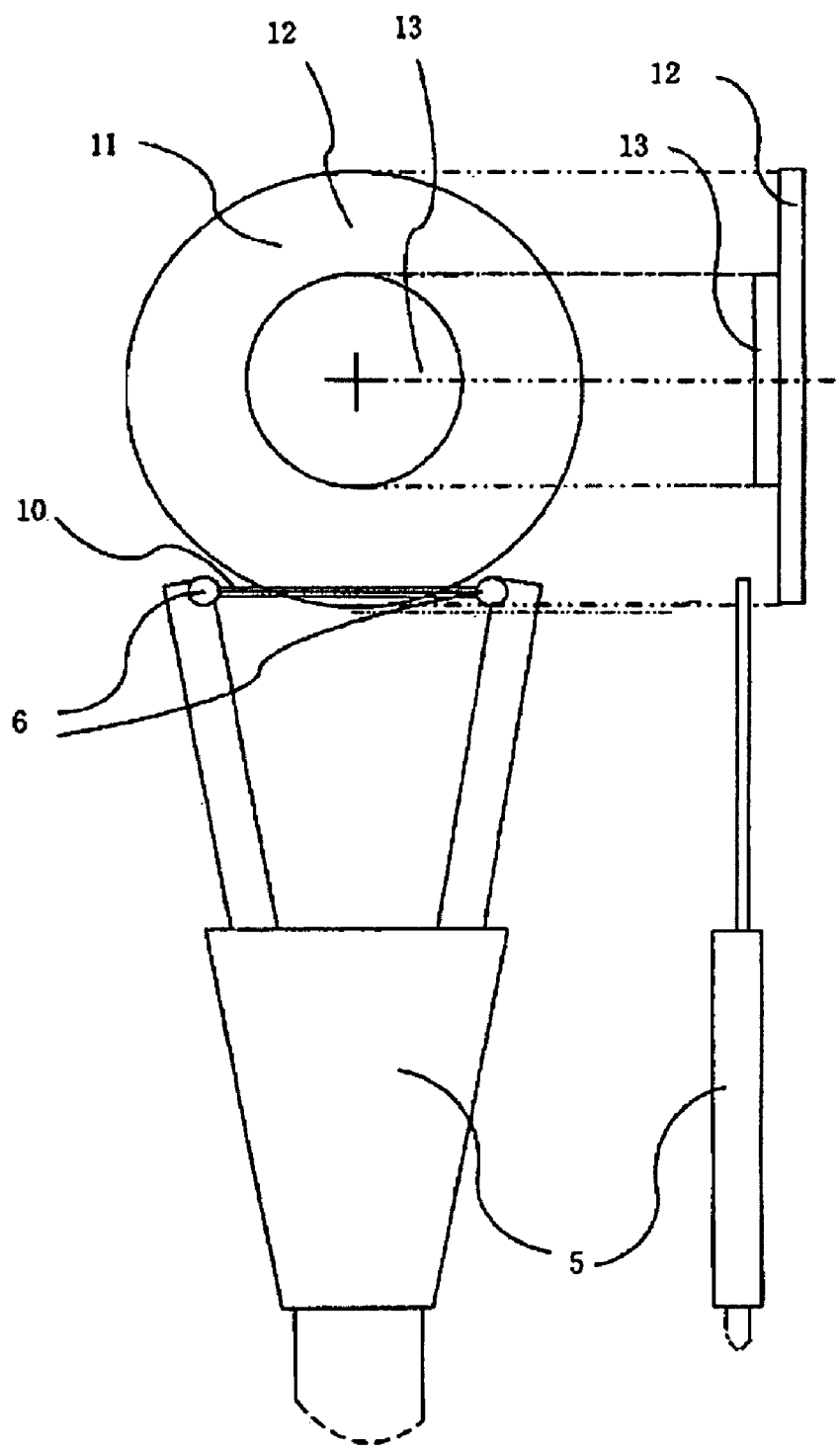
FIG. 12A is another explanatory top view showing the positional relationship between a wafer gripping portion and a teaching tool during the calibration operation.
FIG. 12B is another explanatory side view showing the positional relationship between a wafer gripping portion and a teaching tool during the calibration operation.
Figures 13A, 13B:
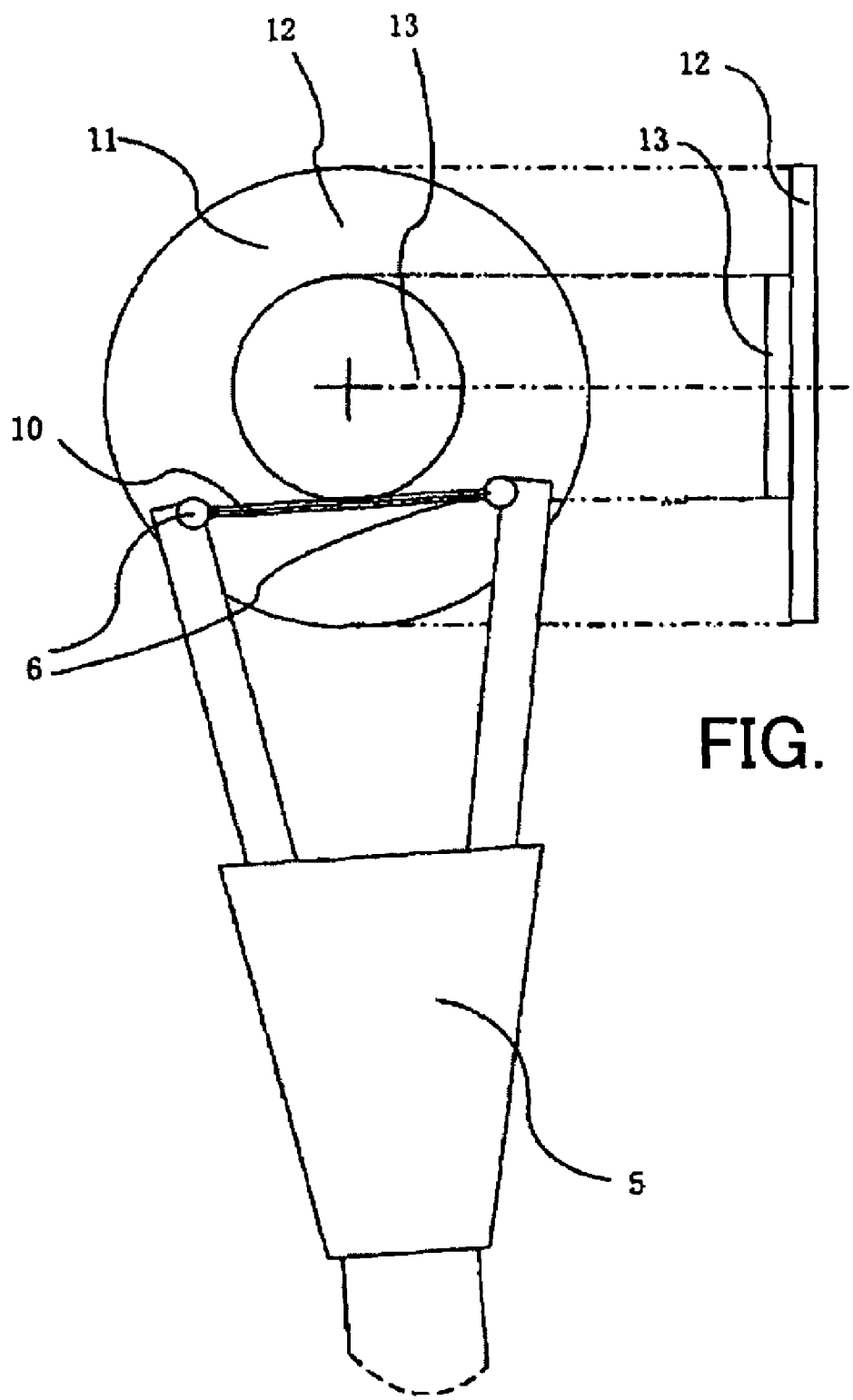
FIG. 13A is yet another explanatory top view showing the positional relationship between a wafer gripping portion and a teaching tool during the calibration operation.
FIG. 13B is a side view showing the teaching tool shown in FIG. 13A.

FIG. 10 is a flowchart of a calibration method according to an embodiment of the present invention. FIG. 11A is an explanatory plan view showing the positional relationship between the wafer gripping portion 5 and the teaching tool 11 under the calibration operation, FIG. 11B is an explanatory side view thereof, FIG. 12A is another explanatory plan view thereof, FIG. 12B is another explanatory side view thereof, FIG. 13A is yet another explanatory plan view thereof, and FIG. 13B is yet another explanatory side view. Now, the calibration method will be explained step by step.

(Step 1) The teaching tool 11 is set to the wafer gripping portion 5 of the robot 1.

(Step 2) The teaching position in which the robot 1 can dispose a wafer W is set to (θs1, Rs1, Zs1, Ts1) since the position of the temporary station 23 is known from the information of the apparatus drawing, etc.

(Step 3) It is set to i=1.

(Step 4) The teaching tool 11 is disposed to the teaching position (θsi, Rsi, Zsi, Tsi), i.e., the temporary station 23, by the robot 1.

(Step 5) The wafer gripping portion 5 is automatically moved under the large circular disc portion 12 since the teaching position (θsi, Rsi, Zsi, Tsi) where the robot disposed the wafer is known.

(Step 6) The wafer gripping portion 5 is raised (see FIGS. 11 and 12) to detect the lower surface of the large circular disc portion 12 by the permeation type sensor 6, and the coordinate value Z of the Z-axis of the robot 1 at that time is recorded. Then, the wafer gripping portion 5 is further raised to detect the upper surface of the large circular disc portion 12 by the permeation type sensor 6, and the coordinate value Z of the Z-axis of the robot 1 at that time is recorded.

(Step 7) The wafer gripping portion 5 is moved above the large circular disc portion 12. That is, the wafer gripping portion 5 is set to the height where the permeation type sensor 6 can detect the small circular disc portion 13 when the wafer gripping portion 5 is advanced ("advance" denotes the plus (+) directions of the R-axis).

(Step 8) The wafer gripping portion 5 is retreated to the position where the permeation type sensor 6 does not detect the small circular disc portion 13.

(Step 9) The direction of the wafer gripping portion 5 is changed by moving the wafer gripping portion 5 about the θ-axis (see FIG. 13). Next, the wafer gripping portion 5 is advanced by moving the wafer gripping portion 5 about the R-axis to thereby slowly approach the small circular disc portion 13, and the coordinates of θ-axis and R-axis at the time when the permeation type sensor 6 detects the small circular disc portion 13 first (that is, the optical axis 10 touches the circumference of the small circular disc portion 13) are recorded.

(Step 10) Step 8 and Step 9 are repeated by making the wafer gripping portion 5 approach the small circular disc portion 13 from different directions to obtain a plurality of coordinates of the θ-axis and R-axis at the time when the optical axis 10 touches the circumference of the small circular disc portion 13. By solving the least-squares method from these values, the central position (θei, Rei) of the small circular disc portion 13, i.e., the teaching tool is obtained and recorded. As for the algorithm for obtaining the central position using the least-squares method, please see the previously mentioned Patent Documents 1 which details the algorithm.

(Step 11) The difference $\Delta\theta i$ and $\Delta Ri$ between the ($\theta ei$, $Rei$) obtained by sensing the teaching tool 11 disposed on the temporary station 23 at Step 4 and obtained at Step 10 and the teaching position ($\theta ei$, $Rei$) of the teaching tool 11 is calculated and stored. Furthermore, $Rsi$ is also stored.

$$\Delta\theta i=\theta si-\theta ei, \Delta Ri=Rsi-Rei \qquad (3)$$

(Step 12) The teaching tool 11 of the station 23 is held by the robot 1. Since the robot 1 has stored the teaching position ($\theta si$, $Rsi$, $Tsi$) where the teaching tool 11 is disposed, the robot 1 can grasp the teaching tool 11.

(Step 13) In the case of i=2, the routine jumps to Step 16.

(Step 14) Let the placing position of the next (i+1) teaching tool 11 be the following Expression 4.

$$(\theta si+1, Rsi+1, Zsi+1, Tsi+1)=(\theta si, Rsi+Roft, Zsi, Tsi-Roft) \qquad (4)$$

This is because data is measured by sensing the teaching tool 11 with the postures different in expansion/contraction amount of the robot arm, and the same temporary station 23 at the same position is used. In this embodiment, since the plus (+) direction of the R-axis coincide with the plus (+) direction of the T-axis, Roft is added to the R-axis and Roft is subtracted from the T-axis as shown in the aforementioned Expression (4).

(Step 15) Let i=i+1, the routine jumps to Step 4.

(Step 16) The calibration values $\Delta\theta$ and $\Delta R$ are calculated using $\Delta\theta i$, $\Delta Ri$ and $Rsi$ stored at Step 11. In this embodiment, since the number of samples is 2, by solving Expressions 5 and 6, $\alpha$ and $\beta$ can be obtained, and $\Delta\theta$ can be obtained by Expression 2. $\Delta R$ denotes $(\Delta R_1+\Delta R_2)/2$. The obtained $\alpha$, $\beta$, and $\Delta R$ are saved in a controller.

$$\alpha = \frac{-\Delta\theta_1(R_1+L)+\Delta\theta_2(R_2+L)}{R_2-R_1} \qquad (5)$$

$$\beta = \frac{(\Delta\theta_1-\Delta\theta_2)(R_1+L)(R_2+L)}{L(R_2-R_1)} \qquad (6)$$

In the case where the number of samples is N, sensing data can be obtained by replacing the Roft at Step 13 with Roft/(N−1) and changing i=2 into i=N. The calibration value of $\Delta\theta$ can be obtained by applying the least-squares method and the calibration value of $\Delta R$ can be obtained by applying the average value.

(Step 17) The teaching tool 11 on the wafer gripping portion 5 of the robot 1 is collected.

If operation from Step 2 to Step 16 is programmed in advance, the sensor calibration for automatic teaching can be automatically performed without depending on operation of an operator.

Since the explanation of the calibration method is completed, a wafer position teaching method will now be explained below.

Figure 14:
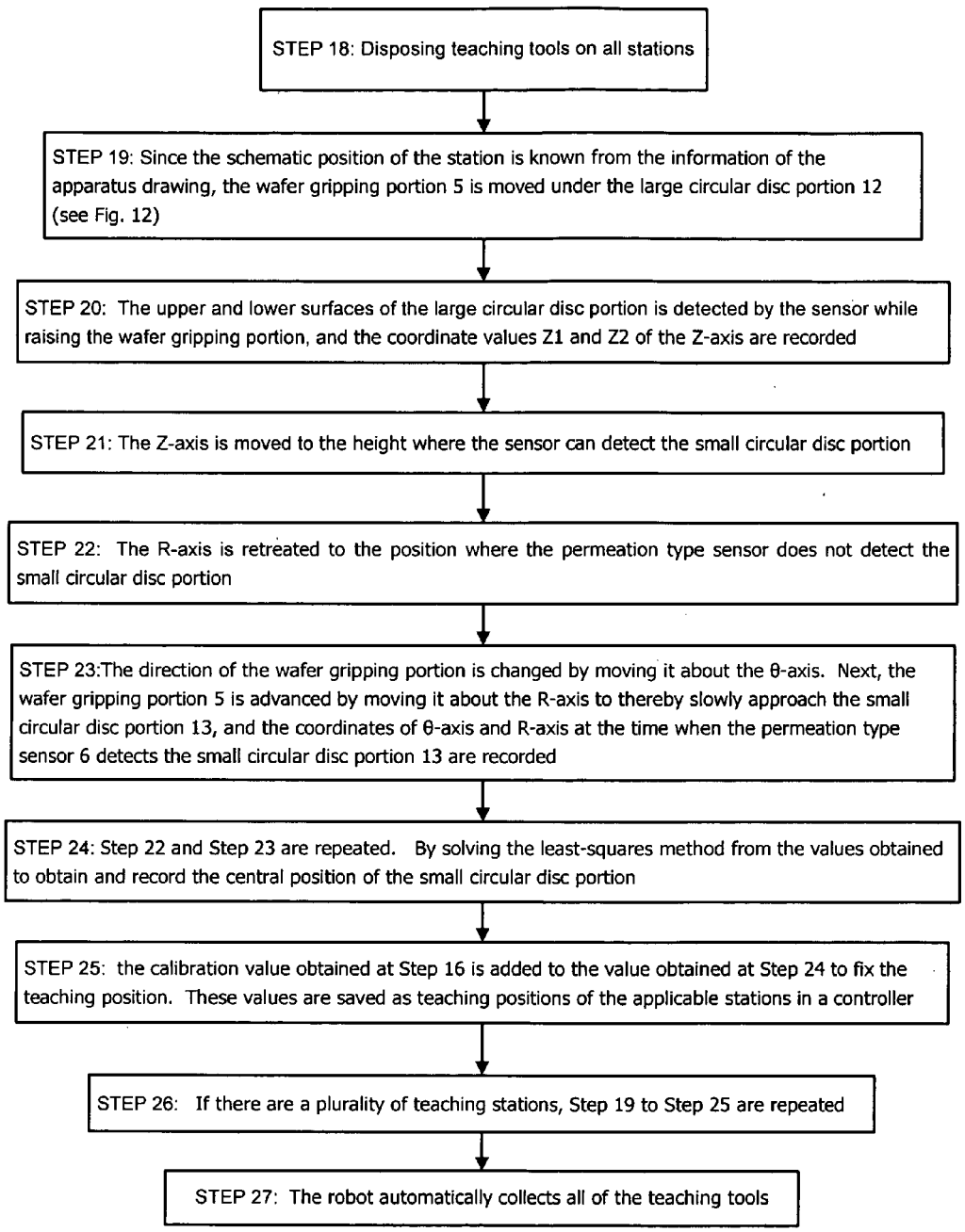
FIG. 14 is a flowchart of a wafer position teaching method according to an embodiment of the present invention.

FIG. 14 is a flowchart of a wafer position teaching method according to an embodiment of the present invention. Hereinafter, a wafer position teaching method will be explained as follows.

(Step 18) The teaching tool 11 is disposed at a semiconductor wafer placing portion, such as, e.g., a storage container. Since the large circular disc portion 12 has exactly the same external diameter as an actual semiconductor wafer, the teaching tool 11 is positioned correctly with a positioning guide, such as, e.g., a storage container. In cases where there exist a plurality of stations to teach, teaching tools 11 are disposed on all stations.

(Step 19) From the information of, e.g., an apparatus drawing, since the schematic position of the wafer teaching position is known and the robot's mechanism is also known, it is possible to obtain the position shown in FIG. 12 by calculating back. Therefore, the wafer gripping portion 5 is automatically moved under the large circular disc portion 12.

(Step 20) The wafer gripping portion 5 is raised (see the postures shown in FIGS. 12 and 13), the lower surface of the large circular disc portion 12 is detected by the permeation type sensor 6, and the coordinate value Z of the Z-axis of the robot at that time is recorded. Furthermore, the wafer gripping portion 5 is further raised to detect the upper surface of the large circular disc portion 12 by the permeation type sensor 6, and the coordinate value Z of the Z-axis of the robot at that time is recorded.

(Step 21) The wafer gripping portion 5 is moved above the large circular disc portion 12. That is, when the wafer gripping portion 5 ("advance" denotes the plus (+) direction of the R-axis) is advanced, the permeation type sensor 6 is set to the height where the sensor 6 can detect the small circular disc portion 13.

(Step 22) The wafer gripping portion 5 is retreated to the position where the permeation type sensor 6 does not detect the small circular disc portion 13.

(Step 23) The direction of the wafer gripping portion 5 is changed by moving the wafer gripping portion 5 about the $\theta$-axis (see FIG. 14). Next, the wafer gripping portion 5 is advanced by moving the wafer gripping portion 5 about the R-axis to thereby slowly approach the small circular disc portion 13, and the coordinates of $\theta$-axis and R-axis at the time when the permeation type sensor 6 detects the small circular disc portion 13 first (that is, the optical axis 10 touches the circumference of the small circular disc portion 13) are recorded.

(Step 24) Step 22 and Step 23 are repeated by making the wafer gripping portion 5 approach the small circular disc portion 13 from different directions to obtain a plurality of coordinates of the $\theta$-axis and R-axis at the time when the optical axis 10 touches the circumference of the small circular disc portion 13. By solving the least-squares method from these values, the central position ($\theta ei$, $Rei$) of the small circular disc portion 13, i.e., the teaching tool 11 is obtained and recorded. As for the algorithm for obtaining the central position using the least-squares method, please see the previously mentioned Patent Documents 1 which details the algorithm.

(Step 25) As to the estimated position of the wafer, $(Z_1+Z_2)/2$ is deemed as a predicted value of the Z-axis from $Z_1$ and $Z_2$ stored at Step 20. The predicted value of the $\theta$-axis and the R-axis is deemed as ($\theta ei+\Delta\theta$, $Rei+\Delta R$) in which the calibration value obtained at Step 16 is added to ($\theta ei$, $Rei$) obtained at Step 24. These values are saved as teaching positions of the applicable stations in a controller.

(Step 26) In cases where there are a plurality of teaching stations, Step 19 to Step 25 are repeated.

(Step 27) Since the teaching position of each station is obtained at Step 25, the robot automatically collects all of the teaching tools 11 in the same manner as the robot collects normal wafers based on the information. "Collection" does not mean that teaching tools 11 are taken out with hands by opening a lid of a processing apparatus for example, but means that teaching tools 11 are conveyed to different slots of a cassette station so as not to be interfered with each other and taken out them collectively. If operation from Step 19 to Step 27 is programmed in advance, the positional teaching of a semiconductor wafer can be automatically performed without depending on operation of an operator.

INDUSTRIAL APPLICABILITY

The present invention can be effectively used as a calibration method of a sensor for teaching a semiconductor wafer position to a semiconductor wafer carrying apparatus.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A method of calibrating an optical axis of a sensor installed on a hand of an arm of a robot by detecting a teaching tool placed at a semiconductor wafer placing position of a storage container or a carrying device by the sensor to teach the placing position of the semiconductor wafer to the robot, the method, comprising the steps of:
   providing the storage container or the carrying device with a calibration station;
   placing the teaching tool at a specified position with the robot;
   predicting a position of the teaching tool by detecting the teaching tool with the sensor to obtain a predicted value;
   obtaining a difference between the position of the teaching tool and the predicted value; and
   performing calibration of the optical axis using the difference.

2. The calibration method of claim 1, wherein operation for predicting a position of a semiconductor wafer by detecting the teaching tool with the sensor is repeated at two or more postures that are different in expansion/contraction amount of the robot arm.

3. The calibration method of claim 2, wherein the calibration station is capable of being accessed in two or more postures postures that are different in expansion/contraction amount of the robot arm.

4. The calibration method of claim 3, wherein the calibration station is provided with a mechanism for holding a wafer in a plane so that a position of the wafer is not shifted when the wafer or the teaching tool is placed with the robot.

* * * * *